United States Patent
Fujii

(10) Patent No.: US 7,821,767 B2
(45) Date of Patent: Oct. 26, 2010

(54) ELECTROSTATIC CHUCK DEVICE

(75) Inventor: Yoshinori Fujii, Susono (JP)

(73) Assignee: Ulvac, Inc., Chigasaki-shi, Kanagawa (JP)

( * ) Notice: Subject to any disclaimer, the term of this patent is extended or adjusted under 35 U.S.C. 154(b) by 153 days.

(21) Appl. No.: 11/666,950

(22) PCT Filed: Oct. 27, 2005

(86) PCT No.: PCT/JP2005/019818

§ 371 (c)(1),
(2), (4) Date: May 3, 2007

(87) PCT Pub. No.: WO2006/049085

PCT Pub. Date: May 11, 2006

(65) Prior Publication Data

US 2007/0297118 A1    Dec. 27, 2007

(30) Foreign Application Priority Data

Nov. 4, 2004  (JP)  .............................. 2004-320078

(51) Int. Cl.
*H01L 21/683* (2006.01)
(52) U.S. Cl. ...................................... 361/234
(58) Field of Classification Search ................. 361/234; 156/345.51, 643
See application file for complete search history.

(56) References Cited

U.S. PATENT DOCUMENTS

| | | | | |
|---|---|---|---|---|
| 4,384,918 A | * | 5/1983 | Abe | 216/71 |
| 4,692,836 A | * | 9/1987 | Suzuki | 361/234 |
| 5,151,845 A | * | 9/1992 | Watanabe et al. | 361/234 |
| 5,671,116 A | * | 9/1997 | Husain | 361/234 |
| 5,677,824 A | * | 10/1997 | Harashima et al. | 361/234 |
| 5,880,924 A | * | 3/1999 | Kumar et al. | 361/234 |
| 5,904,779 A | | 5/1999 | Dhindsa et al. | |
| 5,923,521 A | * | 7/1999 | Burkhart | 361/234 |
| 6,236,555 B1 | * | 5/2001 | Leeser | 361/234 |
| 7,265,963 B2 | * | 9/2007 | Hirose | 361/234 |
| 7,535,688 B2 | * | 5/2009 | Yokouchi et al. | 361/56 |
| 7,706,907 B2 | * | 4/2010 | Hiroki | 700/114 |

FOREIGN PATENT DOCUMENTS

| | | |
|---|---|---|
| JP | 2000-236014 A | 8/2000 |
| JP | 2001-343755 A | 12/2001 |
| JP | 2002-270682 A | 9/2002 |
| JP | 2004-014868 A | 1/2004 |

* cited by examiner

*Primary Examiner*—Jared J Fureman
*Assistant Examiner*—Angela Brooks
(74) *Attorney, Agent, or Firm*—Carothers & Carothers

(57) ABSTRACT

The object of this invention is to provide that an electrostatic chuck device which can properly and promptly diselectrify a substrate to be processed.

In an electrostatic chuck device (11) attracting a substrate (W) to be processed on the surface of a susceptor (12) electrically, a diselectrifying circuit is provided which includes diselectrifying electrode means (16) facing the surface of the susceptor (12), a diselectrifying potential (19), and a diselectrifying resistance (17) connected between the diselectrifying electrode means (16) and the diselectrifying potential (19). The resistance value of the diselectrifying resistance (178) is established such that it is lower than that of an insulating layer (13) of the surface of the susceptor (12 and the diselectrifying resistance (17) can hold the potential of the substrate (W) during an electrostatic chuck operation, and such that the diselectrifying resistance 17) can dissipate the potential of the substrate (W) into the ground potential (19) when the electrostatic chuck is canceled. This structure can appropriately and promptly diselectrify the substrate (W).

2 Claims, 8 Drawing Sheets

ELECTROSTATIC CHUCK DEVICE

TECHNICAL FIELD

The present invention relates to an electrostatic chuck device which is used for a semiconductor manufacturing process, for example.

BACKGROUND OF THE TECHNIQUE

Conventionally, when a substrate to be processed such as, for example, a semiconductor wafer which is processed in a vacuum, an electrostatic chuck device is used to fix the substrate in a vacuum chamber. This kind of electrostatic chuck device has an insulating layer (a dielectric layer) on a susceptor for supporting the substrate. Static electricity occurs by applying voltage between the susceptor and the substrate through the insulating layer, thereby the substrate is attracted by the susceptor.

There are mainly a monopole type and a bipolar type electrostatic chuck mechanism. FIG. 10 shows diagrammatically a configuration of a prior art electrostatic chuck device 1 having the electrostatic chuck mechanism of the bipolar type.

Referring to FIG. 10, an insulating layer 3 on which semiconductor substrate W is placed, is formed on the surface of a susceptor 2. Plural electrostatic chuck electrodes 4A, 4A, 4B and 4B are placed in the inside of the susceptor 2 and positioned to be facing the back surface of the semiconductor substrate W which is placed on the insulating layer 3.

At first, the semiconductor substrate W is placed on the surface of the susceptor 2. Next, the chuck electrodes 4A are connected to a predetermined positive potential source 5A, and the chuck electrodes 4B are connected to a predetermined negative potential source 5B. As a result, the back surface of the semiconductor substrate W is electrified with the polarity shown in FIG. 10. Static electricity occurs between the substrate W and the chuck electrodes 4A and 4B through the insulating layer 3, whereby the semiconductor substrate W is attracted and held to the surface of the susceptor 2.

When the semiconductor substrate W is detached from the susceptor 2, the chuck electrodes 4A and 4B are connected to the ground potential as shown in FIG. 11, respectively, whereby these chuck electrodes 4A and 4B are diselectrified. Thus, the static electricity between the semiconductor substrate W and the chuck electrodes 4A and 4B disappears. Afterwards, the back surface of the semiconductor substrate W is pushed up by lifter pins (not shown), and the semiconductor substrate W is transported to the next process through a transportation robot (not shown).

The chuck electrodes 4A and 4B are generally made of low resistance material (for example carbon, aluminum, copper). Thus, after having interrupted voltage power supply to these chuck electrodes 4A and 4B, if the chuck electrodes chuck 4A and 4B are connected to ground potential, the diselectrification of the chuck electrodes 4A and 4B is completed instantly. In contrast, because the insulating layer 3 made of high resistance material intervenes between the semiconductor substrate W and the chuck electrodes 4A and 4B, diselectrification of the substrate W cannot be performed positively. Therefore, depending on the resistance value of the insulating layer 3, considerable time is needed for diselectrification of the substrate W.

Thus, after having connected the chuck electrodes 4A and 4B to ground potential, there is the case that the electrostatic attraction exists between the back surface of the semiconductor substrate W and the insulating layer 3. In this case, there is a fear that the substrate W will be damaged by the upthrust of the lifter pins or that a transportation error of the substrate W will occur.

Another method for diselectrification of the substrate is to constitute the lifter pins of metal and to connect them to ground potential. As a result, the substrate is diselectrified by contact with the lifter pins. However, depending on the quantity of the electric charge remaining in the substrate W, there is the case that an arc discharge occurs between the substrate and the lifter pins. In this case, discharge signs are formed on the substrate back surface. Furthermore, there is the possibility that the elements on the substrate are damaged.

As conventional substrate diselectrification methods, there are diselectrification by applying reverse voltage, diselectrification by using plasma and diselectrification by heating up the insulating layer to solve such problems.

Diselectrification by applying reverse voltage is a method which provides a reverse electric potential to the chuck electrodes 4A and 4B, and which dissipates the electric charge from the semiconductor substrate W. The method of diselectrification by using a plasma generates a plasma in a process chamber after having connected the chuck electrodes 4A and 4B to ground potential, and dissipates the substrate W through the plasma, as shown typically in FIG. 12 (see patent document 1). The method of diselectrification by heating up the insulating layer 3 is a method which decreases the specific resistance of the insulating layer 3 by raising its temperature and which promotes diselectrification of the semiconductor substrate W.

Patent Document 1: JP2004-14868

DISCLOSURE OF INVENTION

Problem to be Solved by the Invention

Although diselectrification by applying a reverse voltage can accelerate the diselectrification of the dielectric layer (insulating layer 3), there is a problem that the potential of the substrate cannot be immediately dissipated.

Diselectrification by using a plasma has many problems. That is to say, this method can not be applied to the process that cannot use a plasma. Diselectrification effect of a central part of the back surface of the substrate is little. Because the electrode (ground) for diselectrification always faces a process chamber, film formation material is deposited on to the electrode, and the electrode is deteriorated by sputtering. As a result, frequent reproduction maintenance of the electrode becomes necessary.

Even more particularly, in the diselectrification by heating up of the insulating layer 3, there is the fear that element deterioration is caused depending on the kinds of substrate W because the substrate temperature also rises with rise in operation temperature of the insulating layer 3. Also, it takes considerable time to raise the temperature of the insulating layer 3.

This invention was made in consideration of the above problems. It is an object of the present invention to provide an electrostatic chuck device which can properly and immediately diselectrify a substrate regardless of the kind of process.

SUMMARY OF THE INVENTION

To solve the above object, an electrostatic chuck device of the present invention is characterized by providing a diselectrifying circuit which includes:

a diselectrifying electrode means facing the surface of a susceptor, a diselectrifying potential and, diselectrifying resistance connected between the diselectrifying electrode means and the diselectrifying potential, wherein the diselectrifying electrode means is arranged at a position where the diselectrifying electrode means always contacts with the back surface of the substrate to be placed on the surface of the susceptor, and the diselectrifying resistance is a variable resistor.

In the diselectrifying circuit of the above construction, the diselectrifying electrode means always contacts with the back surface of the substrate which is placed on the susceptor. The diselectrifying electrode means is connected to the diselectrifying potential (for example, ground potential) through the diselectrifying resistance. The resistance value of the diselectrifying resistance is established such that it is lower than that of an insulating layer of the surface of the susceptor, such that the diselectrifying resistance can hold the potential of the substrate during an electrostatic chuck operation, and such that the diselectrifying resistance can dissipate the potential of the substrate into the diselectrifying potential when the electrostatic chuck is canceled. This resistance value can be appropriately established depending on applied voltage in the electrostatic chuck or process condition.

According to the present invention, the diselectrifying electrode means is always contacting with the substrate to be processed, and appropriate diselectrifying resistance intervenes between the diselectrifying electrode means and the diselectrifying potential. Accordingly, diselectrification of the substrate can be processed properly without causing over-discharge such as an arc, at the time of diselectrification of the substrate. The substrate is diselectrified as soon as the chuck electrode is connected to ground potential. Further, the diselectrification process can be performed immediately because diselectrification efficiency is high.

The position in which the diselectrifying electrode means is formed, is not limited in particular, but it is preferred that the diselectrifying electrodes means is formed on the periphery of the susceptor or the surface of the susceptor through the space between plural chuck electrodes placed in the inside of the susceptor. Also, the diselectrifying electrode means can be comprised with a conductor film which is formed in a film forming process onto the susceptor surface, or can be comprised with a metallic projection. The formation of the diselectrifying electrode means can be chosen in scope to be able to obtain a desired electrostatic chuck function.

The diselectrifying potential may be ground potential, and may be a predetermined power supply potential which can supply a potential different from the potential of the substrate.

The diselectrifying resistance represents a resistance component between the diselectrifying electrode means and the diselectrifying potential. The diselectrifying resistance is comprised with a resistance element such as a resistor placed between the diselectrifying electrode means and the diselectrifying potential, but it may be comprised with a resistance component of wiring material.

The diselectrifying resistance is a variable resistance. In this case, the diselectrifying resistance is established at its higher resistance side in order to restrain leakage of the electric potential of the substrate during an electrostatic chuck operation, and is established at its lower resistance side in order to dissipate the potential of the substrate immediately when the electrostatic chuck is canceled. In the diselectrifying circuit regarding the present invention, a similar effect can be obtained by including a switch means which connects/cuts-off electrically between the diselectrifying electrode means and the diselectrifying potential. That is, leakage of the substrate potential during an electrostatic chuck operation can be prevented by switch-off of the switch means, and diselectrification of the substrate can be immediately performed by switch-on of the switch means.

EFFECT OF THE INVENTION

As above described, according to an electrostatic chuck device of the present invention, it can properly and immediately diselectrify a substrate to be processed. Thus, at detachment, the substrate can be prevented from transportation error or damage by the influence of the residual charge, and through-put and productivity can be improved.

Figure 1:
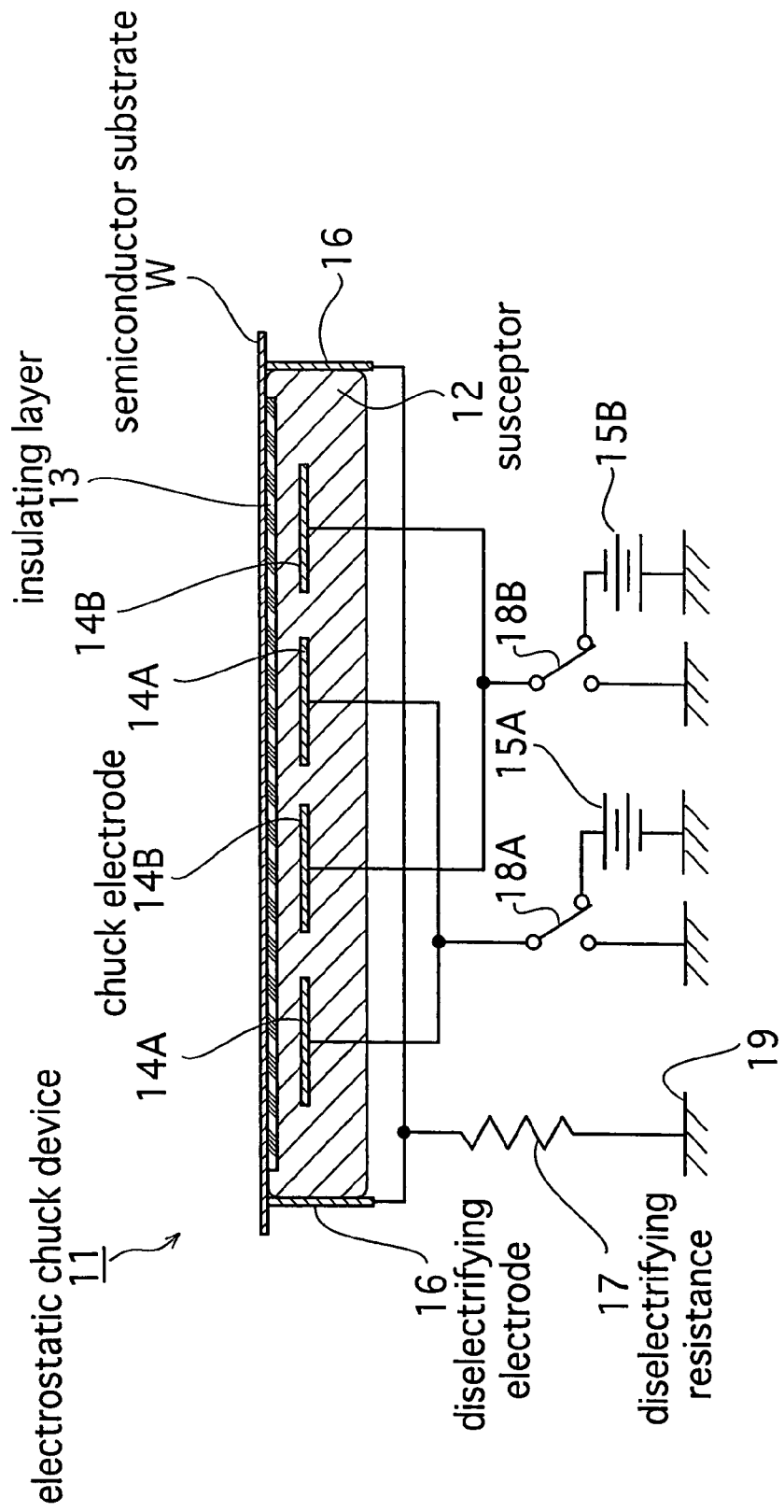
FIG. 1 is a schematic view of an electrostatic chuck device 11 according to a first embodiment of the present invention.

EXPLANATIONS OF LETTERS OR NUMERALS 11,21,31,41,51,61 electrostatic chuck device
12 susceptor
13 insulating layer
14,14A,14B chuck electrode
15,15A,15B electric potential source for chuck
16,52 diselectrifying electrode
27 diselectrifying resistance
19,49 diselectrifying potential
38 switch
53 biasing member
62 lifter pin (diselectrifying electrode)
63 lift unit

BEST EMBODIMENT OF INVENTION

Each embodiment of the present invention will be described with reference to the drawings. Note that, the present invention is not limited to the following embodiments, and various kinds of modifications are possible based on the technical idea of the present invention.

First Embodiment

FIG. 1 is a schematic view showing a configuration of an electrostatic chuck device 11 according to a first embodiment of the present invention. The electrostatic chuck device 11 of this embodiment comprises mainly, a susceptor 12 which supports a semiconductor substrate W; an insulating layer (dielectric layer) 13 formed on the surface of the susceptor 12; plural chuck electrodes 14A and 14B which are arranged in the inside of the susceptor 12 and which are facing the semiconductor substrate W through insulating layer 13; and diselectrifying electrode 16 which is faced to the surface of the susceptor 12 and which can contact with the back surface of the semiconductor substrate W.

The susceptor 12 is made of ceramic or other insulating material and is installed in a process chamber of a vacuum chamber which is not illustrated. The insulating layer 13 is made of PBN (pyrolytic boron nitride), AlN (aluminum nitride) in this embodiment, but of course it can be made of insulating materials other than these. The insulating layer 13 may be formed on the whole of the surface of the susceptor not only a part of the surface of susceptor 13.

The chuck electrodes 14A and 14B are made of low resistive material such as carbon, aluminum, copper and so forth. The chuck electrodes 14A are connected to a positive potential source 15A, and the chuck electrodes 14B are connected to a negative potential source 15B. Switches 18A and 18B are arranged between the chuck electrodes 14A, 14B and the potential sources 15A, 15B. These switches 18A and 18B are respectively switched to the ground potential side when the semiconductor substrate W is diselectrified.

The diselectrifying electrode 16 is arranged at a position where the diselectrifying electrode 16 always contacts with the back surface of the semiconductor substrate W to be placed on the surface of the susceptor 12. In this embodiment, the position where the diselectrifying electrode 16 is attached is good at all areas on the periphery of the susceptor 12, and the diselectrifying electrode 16 may be arranged at plural positions of equality angular intervals or inequality angular intervals along the periphery of the susceptor 12.

Figure 2A:
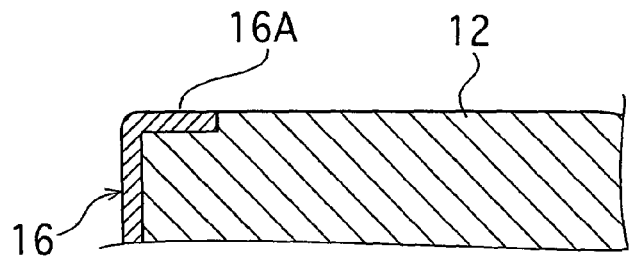
FIGS. 2A, 2B and 2C are enlarged partial views of examples of the top surface 16A of diselectrifying electrodes 16.
Figure 2B:
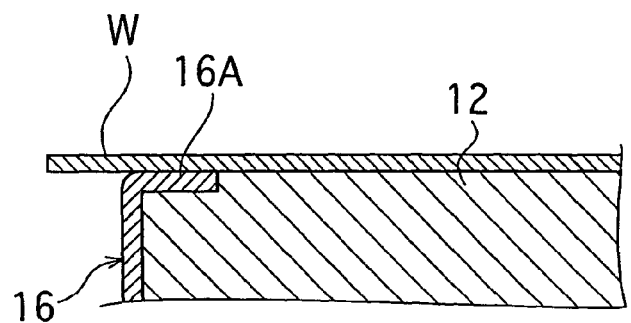
Figure 2C:
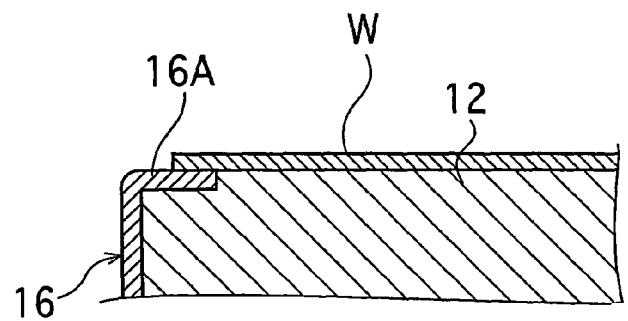

As shown in FIG. 2A, the tip 16A of the diselectrifying electrode 16 covers the predetermined area on the top surface of the periphery of the susceptor 12. Accordingly, contact area with the back surface of semiconductor substrate W can be enlarged. Further, as shown in FIGS. 2B and 2C, the electrode tip 16A can properly contact with the back surface of the substrate W not only when the size (diameter) of the semiconductor substrate W is larger than the surface size of the susceptor 12, but also when it is small.

Figure 3:
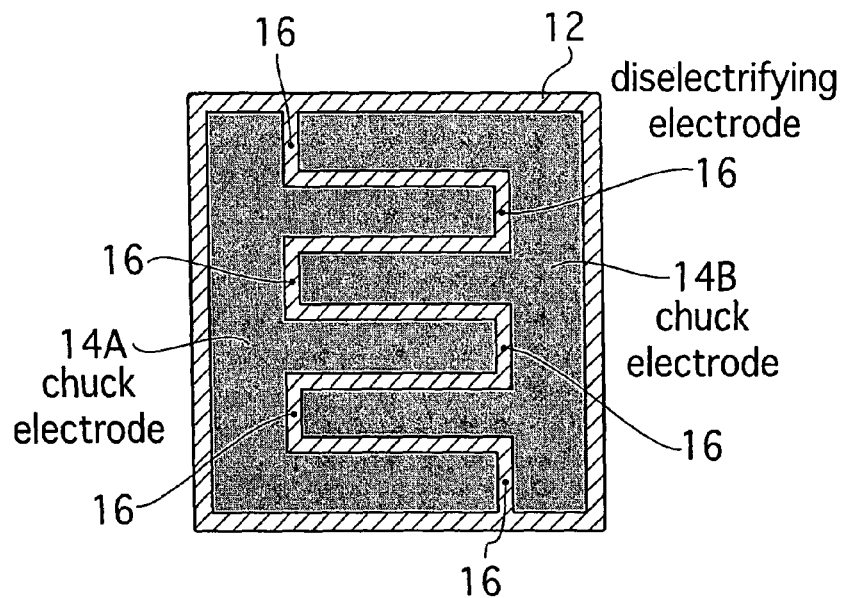
FIG. 3 is a view of one example of diselectrifying electrodes 16 arranged between chuck electrodes 14A and 14B.
Figure 4:
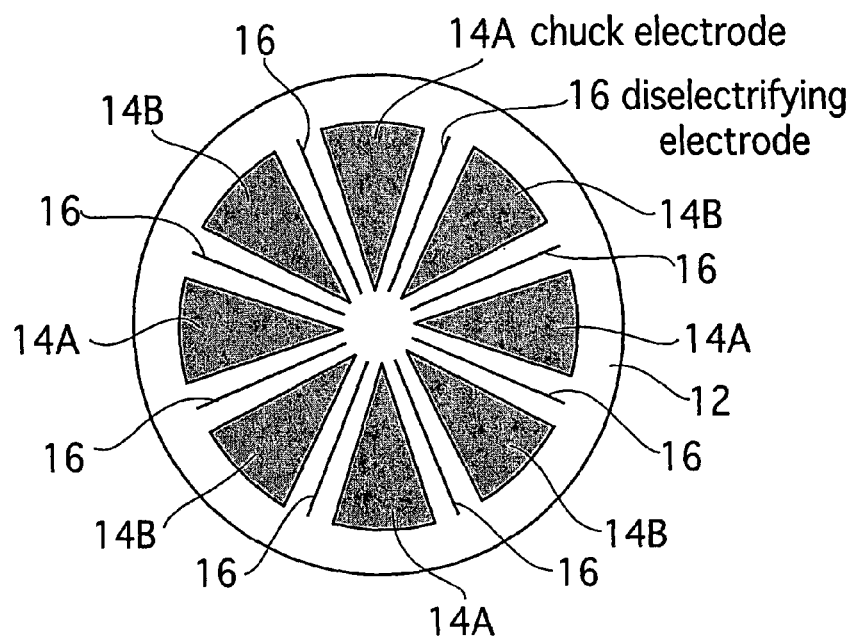
FIG. 4 is a view of another example of diselectrifying electrodes 16 arranged between chuck electrodes 14A and 14B.

The diselectrifying electrode 16 may be arranged not only on the periphery of the susceptor 12 but also for example through spaces between the chuck electrodes 14A and 14B, as shown in FIG. 3 and FIG. 4. In these cases, the diselectrifying electrodes 16 are formed so as to face the surface of the insulating layer 13 through the spaces between the chuck electrodes 14A and 14B placed at the inside of the susceptor 12. Also, the formation of the tip of the diselectrifying electrode 16 may be spotted, as shown in FIG. 3, and linear, as shown in FIG. 4. The chuck electrodes 14A and 14B are pectinate shape in FIG. 3 and are fan shaped in FIG. 4.

The material of the diselectrifying electrode 16 is not limited in particular, but low resistive material such as a metal is preferable. Also, as a configuration of the diselectrifying electrode 16, a conductor film formed on the periphery (and a part of surface thereof) of susceptor 12 in the film process can be applied. The diselectrifying electrode 16 may also be a bulk. In this embodiment, the diselectrifying electrode 16 is formed by a copper film.

The diselectrifying electrode 16 is connected to ground potential 19 which corresponds to the diselectrifying potential in this invention, through a diselectrifying resistance 27. The diselectrifying resistance 27 is a variable resistance and has a resistance value that can restrain a leakage of a potential of the semiconductor substrate W during an electrostatic chuck operation, and that can dissipate the potential of the semiconductor substrate W into the ground potential when the electrostatic chuck is canceled.

This diselectrifying resistance 27 is established toward its higher resistance side in order to restrain the leakage of the potential of the semiconductor substrate W during an electrostatic chuck operation, and is established toward its lower resistance side in order to immediately dissipate the substrate potential when the electrostatic chuck is canceled.

The resistance value of this diselectrifying resistance 27 is appropriately determined, depending on chuck potential (potential supplied to potential sources 15A and 15B), distance between the substrate W and chuck electrodes 14A and 14B, a square measure and arrangement number of the chuck electrodes 14A and 14B, and the process condition of the semiconductor substrate W. In any case it is necessary that the resistance value of the diselectrifying resistance be lower than the resistance value of insulating layer 13. In one instance, when the chuck potential is 3,600V, the resistance value of the diselectrifying resistance 27 during an electrostatic chuck operation is established to be larger than 1 k$\Omega$, preferably is 0.5 M$\Omega$. In this case, the resistance value of the diselectrifying resistance is lower than 1 k$\Omega$ when the electrostatic chuck is canceled.

A diselectrifying circuit of this invention consists of the diselectrifying electrode 16, the diselectrifying resistance 27 and the ground potential 19.

The electrostatic chuck device 11 of this embodiment is constructed as above. When the electrostatic chuck device 11 attracts and holds the semiconductor substrate W which has been placed on the surface of the susceptor 12, the chuck electrodes 14A are connected to the positive potential source 15A, and the chuck electrodes 14B are connected to the negative potential source 15B, and the predetermined positive potential and negative potential are supplied to the chuck electrodes 14A and 14B, respectively. Therefore, each area of the semiconductor substrate W back surface opposed to the chuck electrode 14A and 14B is polarized in each negative charge and positive charge by electrostatic induction through the insulating layer 13, and is electrified. As a result, an electrostatic attraction force occurs between the semiconductor substrate W and the susceptor 12, and the semiconductor substrate W is held on the susceptor 12.

Then, there is a fear that the potential of the substrate W will leak out into the ground potential 19 side because the diselectrifying electrode 16 contacts with the back surface of the semiconductor substrate W, but the leakage can be controlled by establishing the diselectrifying resistance 27 at its higher resistance side as above mentioned.

Also, the negative charge is supplied from the ground potential 19 to the semiconductor substrate W through the diselectrifying resistance 27 because the diselectrifying electrode 16 contacts with the back surface of the semiconductor substrate W. It contributes to increase in attraction force of the semiconductor substrate W. Such an effect becomes particularly remarkable when the chuck electrode consists of a single electrode and when the semiconductor substrate is electrified by a negative charge.

The semiconductor substrate W is detached from the susceptor 12 after a predetermined process (for example, a film forming process or an etching process) for the semiconductor substrate W has been completed. Then, it needs to release the attraction power between the substrate W and the susceptor 12 by diselectrifying the substrate W.

In this embodiment, the switches 18A and 18B are respectively changed over from the potential source side into the ground potential side and the diselectrifying resistance 27 is changed to its lower resistance side, and thereby the chuck electrodes 14A and 14B are diselectrified. Afterwards, the semiconductor substrate W is mainly diselectrified through the diselectrifying electrode 16. That is to say, diselectrification of semiconductor substrate W is performed immediately just to change the switches 18A, 18B and the resistance value of the diselectrifying resistance 27. Afterwards, the semiconductor substrate W is lifted by lifter pins (not shown) towards the upper side, and is transported to the next process by a predetermined transportation robot (not shown).

According to this embodiment, the diselectrification of the semiconductor substrate W can be performed properly, so that it can be prevented from transportation error or damage when the substrate W is detached. Also, electrostatic chuck device 11 can be produced with low cost because the configuration of the diselectrifying circuit can be simplified very much. Further, the detachment of semiconductor substrate W can be operated without decreasing through-put of the process or productivity because it does not need a special processing operation for diselectrification.

Further still, the diselectrifying electrode 16 always contacts with the back surface of the semiconductor substrate W, and the diselectrifying resistance 27 intervenes between the diselectrifying electrode 16 and the ground potential 19. Hence, the generation of overdischarge such as the arc can be suppressed when the semiconductor substrate W is diselectrified. Accordingly, the semiconductor substrate W can be protected.

Furthermore, an attraction power of the semiconductor substrate W and efficiency of the diselectrification can be raised more, so that the diselectrification time can be largely shortened. Also, because the diselectrifying resistance 27 can be appropriately adjusted depending on the conditions of the process for the semiconductor substrate W, a preferable chuck potential which is different for every process, can be supplied to the semiconductor substrate W.

Second Embodiment

Figure 5:
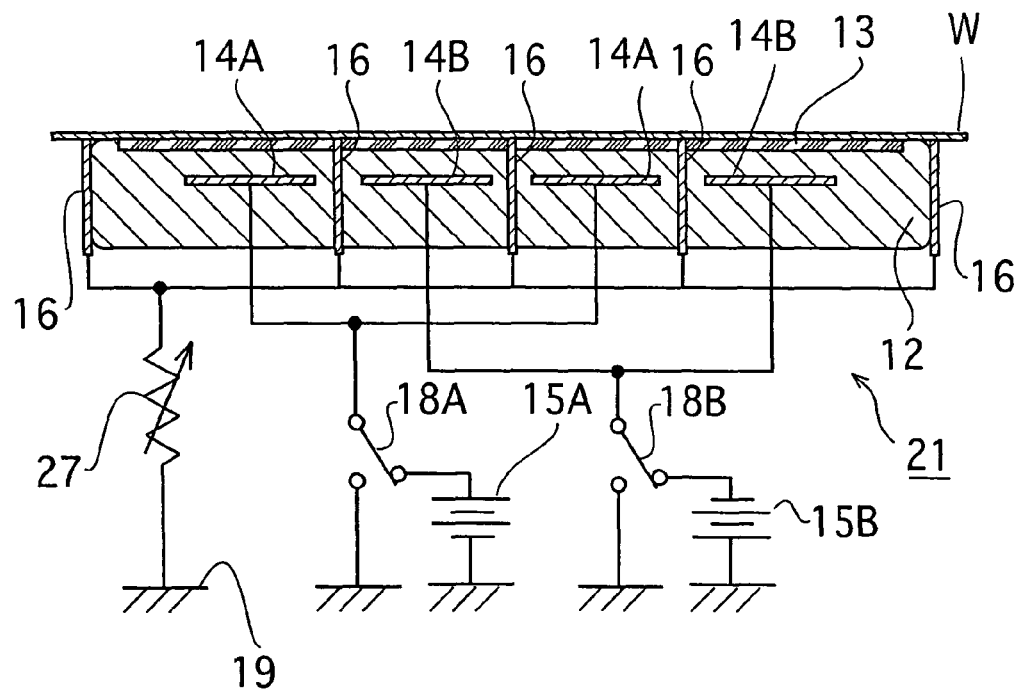
FIG. 5 is a schematic view of an electrostatic chuck device 21 according to a second embodiment of the present invention.

FIG. 5 is a schematic view of an electrostatic chuck device 21 according to a second embodiment of the present invention. Parts that correspond to those in the above first embodiment, are denoted by the same reference numerals, the detailed description of which will be omitted.

In this embodiment, the electrostatic chuck device 21 has the diselectrifying electrodes 16 facing the surface of the susceptor 12. The diselectrifying electrodes 16 are arranged not only on the periphery of the susceptor 12 but also at interior portions of the surface of the susceptor 12. The diselectrifying electrodes 16 arranged at the interior portions of the surface of the susceptor 12 intervene between plural chuck electrodes 14A and 14B placed inside of the susceptor 12. The tips of the diselectrifying electrodes 16 are exposed in a point shape or linear shape toward the surface of the insulating layer 13 between the electrodes 14A and 14B as shown in FIG. 3 and FIG. 4.

Therefore, when the semiconductor substrate W is diselectrified, a diselectrification effect that is approximately uniform in the whole area of substrate W can be obtained. The diselectrification efficiency can be improved and the diselectrification time can be shortened.

Third Embodiment

Figure 6:
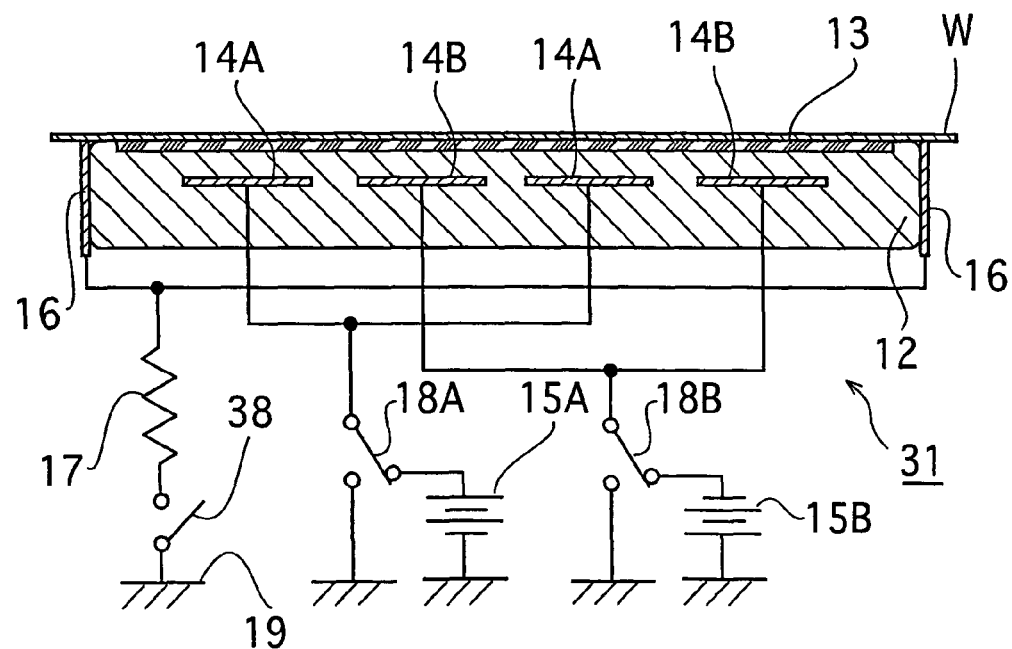
FIG. 6 is a schematic view of an electrostatic chuck device 31 according to a third embodiment of the present invention.

FIG. 6 is a schematic view of an electrostatic chuck device 31 according to a third embodiment of the present invention. Parts that correspond to those in the above first embodiment, are denoted by the same reference numerals, the detailed description of which will be omitted.

In this embodiment, the electrostatic chuck device 31 has a switch 38 arranged between the diselectrifying resistance 27 and the ground potential 19, whereby a diselectrifying circuit for the semiconductor substrate W is comprised. This switch 38 corresponds to "the switching means" of the present invention. The switch 38 may be constituted by a mechanical switch member or an electronic circuit such as a transistor.

According to this embodiment, because the switch 38 which electrically connects/cuts-off between the diselectrifying electrode 16 and the diselectrifying potential (ground potential) 19 is included, leakage of the substrate potential can be prevented by switch-off of the switch 38 during an electrostatic chuck operation, and the diselectrification of the substrate W can be immediately performed by switch-on of the switch 38. Accordingly, the resistance of the diselectrifying resistance 27 can be lower, and the possibility of an adverse effect on a process, such as RF plasma treatment wherein substrate electrification potential is important, can be cleared. Also, generation of an arc between the diselectrifying electrode 16 and the semiconductor substrate W can be restrained by installation of the diselectrifying resistance 27.

Fourth Embodiment

Figure 7:
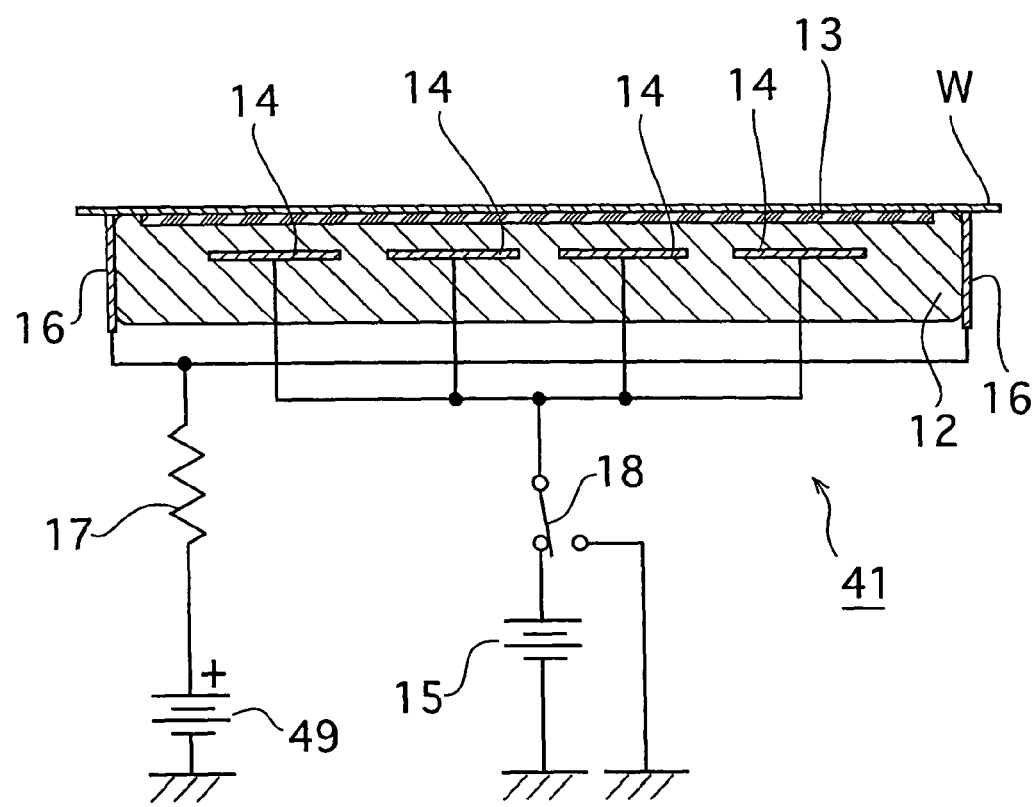
FIG. 7 is a schematic view of an electrostatic chuck device 41 according to a fourth embodiment of the present invention.

FIG. 7 is a schematic view of an electrostatic chuck device 41 according to a fourth embodiment of the present invention. Parts that correspond to those in the above first embodiment, are denoted by the same reference numerals, the detailed description of which will be omitted.

In electrostatic chuck device 41 of this embodiment, a positive electric potential source 15 is connected through a switch 18 to the chuck electrodes 14 which are placed at inside of the susceptor 12. Particularly, an example wherein a diselectrifying circuit has been comprised by a positive potential source 49 supplying a potential different from the potential of the semiconductor substrate W is shown.

According to this embodiment, because the diselectrification of the semiconductor substrate W can be performed positively by the positive potential source 49, the diselectrification efficiency of the semiconductor substrate W can be improved, and an effect that is similar to the first embodiment can be obtained.

Potential level of the positive potential source 49 for diselectrification can be determined depending on the electrification potential of the semiconductor substrate W. Also, the most suitable diselectrification potential, depending on the kind of the semiconductor substrate W, can be provided if this positive potential source 49 is comprised of a variable potential source. Of course, the potential source 49 for the diselectrification is comprised of a negative potential source when the potential source supplying the chuck electrodes 14 is comprised of the negative potential source.

Fifth Embodiment

Figure 8:
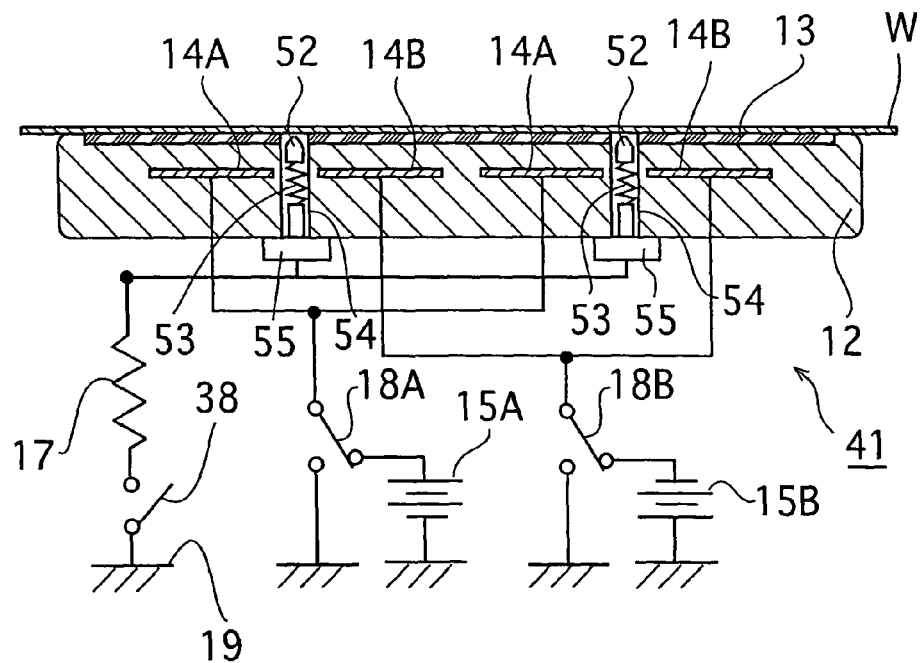
FIG. 8 is a schematic view of an electrostatic chuck device 51 according to a fifth embodiment of the present invention.

FIG. 8 is a schematic view of an electrostatic chuck device 51 according to a fifth embodiment of the present invention. Parts that correspond to those in the above first embodiment, are denoted by the same reference numerals, the detailed description of which will be omitted.

In the electrostatic chuck device 51 of this embodiment, the back surface of the semiconductor substrate W which is placed on the surface of the susceptor 12 is contacted with diselectrifying electrodes 52 which are accommodated in through-holes 54 formed at the plural positions respectively on the surface of the susceptor 12. These diselectrifying electrodes 52 are connected to connecting terminals 55 attached to the lower limit side of through-holes 54 through coiled spring-shaped biasing members 53, respectively. The biasing members 53 correspond to the "biasing means" of the present invention. The diselectrifying electrodes 52, the biasing members 53 and the connecting terminals 55 consist of a conductive material such as metal respectively.

In this embodiment, similarly to the third embodiment, a diselectrifying circuit for the semiconductor substrate W is comprised in which the switch 38 is placed between the diselectrifying resistance 27 and the ground potential 19. The diselectrifying resistance 27 is connected to the connecting terminals 55 connecting with diselectrifying electrodes 52.

In the electrostatic chuck device 51 of this embodiment, the diselectrifying electrode 52 always contacts with the back surface of semiconductor substrate W which is placed on the surface of the susceptor 12, by the biasing force of the biasing members 53. The biasing force of the biasing members 53 is established enough lower than the self-weight of the semiconductor substrate W. Thus, the chuck power for the semiconductor substrate W provided by the chuck electrodes 14A and 14B is not affected.

In the electrostatic chuck device of this embodiment, when the electrostatic chuck for the semiconductor substrate W is canceled, the switches 18A and 18B are changed over to the ground potential side, thereby the chuck electrodes 14A and 14B are diselectrified. Afterwards, the switch 38 for the diselectrification of the substrate is closed. By closing the switch 38 for diselectrification, the potential of the semiconductor substrate W is dissipated into the ground potential 19 through the diselectrifying electrodes 52, the biasing members 53, the connecting terminals 55, the diselectrifying resistance 27 and the switch 38. Therefore, the semiconductor substrate W is diselectrified.

Accordingly, an effect similar to the respective above-mentioned embodiments can be obtained by the electrostatic chuck device 51 of this embodiment. Particularly according to this embodiment, because the diselectrifying electrodes 52 always contact with the back surface of the semiconductor substrate W with predetermined contact pressure, contact resistance with semiconductor substrate W decreases, and the diselectrification of the semiconductor substrate W can be performed immediately. Also, when camber or waviness occur in semiconductor substrate W, an appropriate contact condition between the diselectrifying electrodes 52 and the semiconductor substrate W can be secured. Also, generation of an arc between the diselectrifying electrodes 52 and the semiconductor substrate W can be restrained by the diselectrifying resistance 27.

Sixth Embodiment

Figure 9:
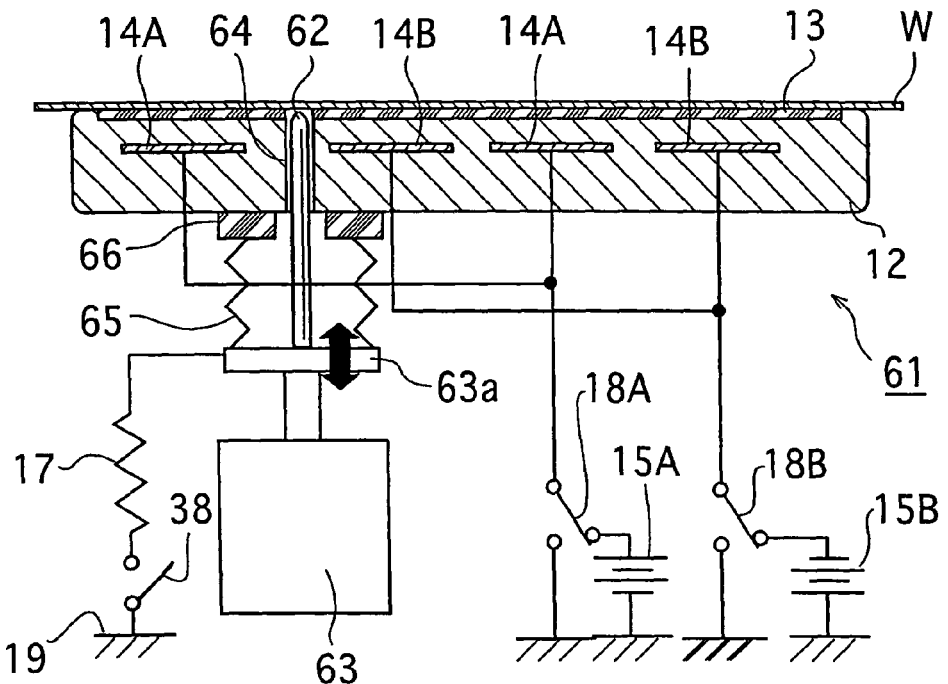
FIG. 9 is a schematic view of an electrostatic chuck device 61 according to a sixth embodiment of the present invention.
Figure 10:
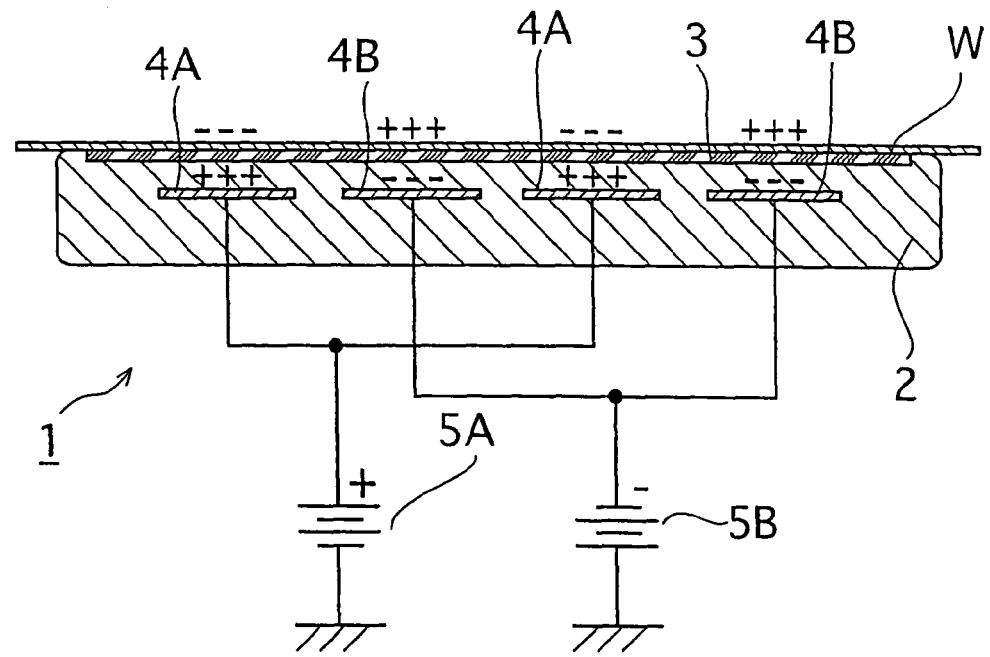
FIG. 10 is a schematic view of a prior art electrostatic chuck device.
Figure 11:
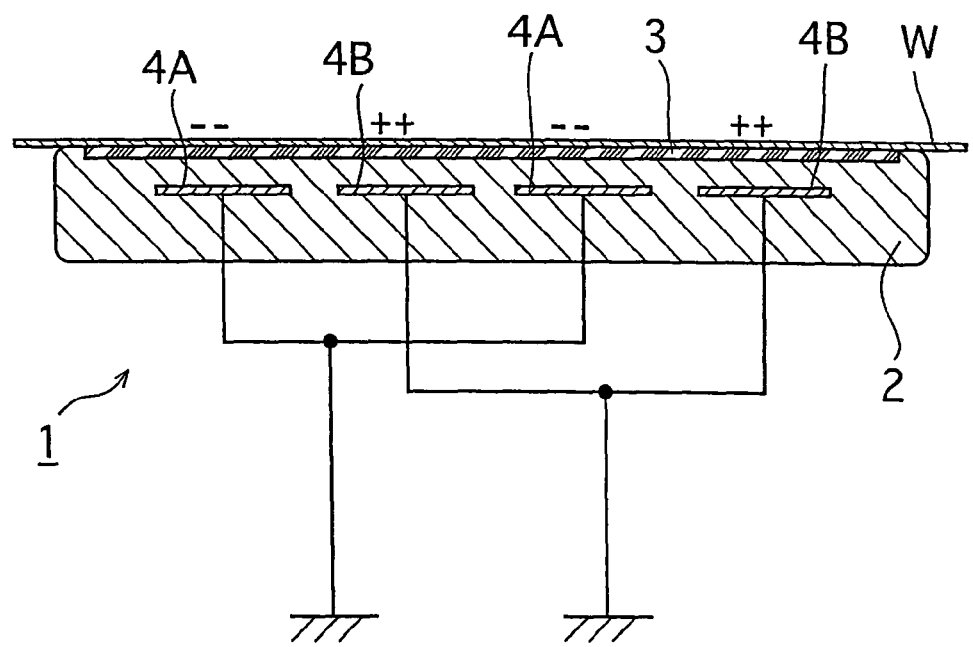
FIG. 11 is a schematic view for explanation of one substrate diselectrification method in a prior art electrostatic chuck device.
Figure 12:
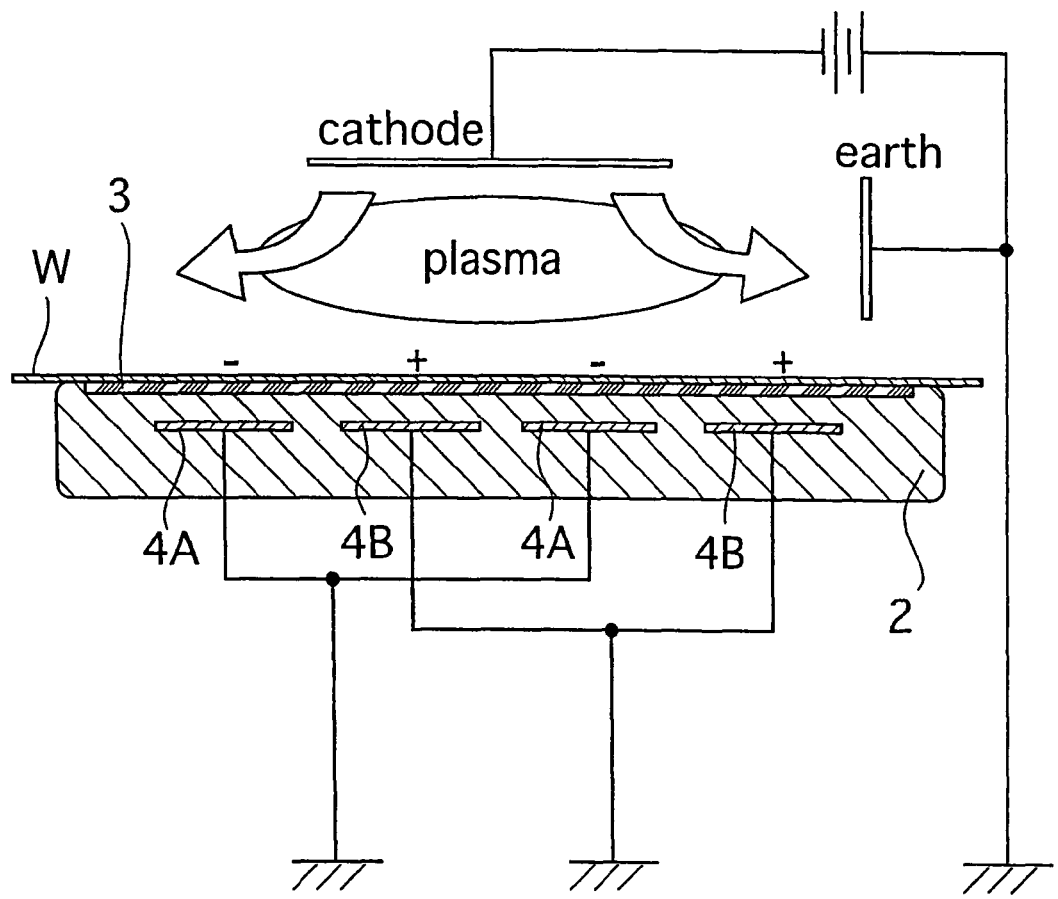
FIG. 12 is a schematic view for explanation of another substrate diselectrification method in a prior art electrostatic chuck device.

FIG. 9 is a schematic view of an electrostatic chuck device 61 according to a sixth embodiment of the present invention. Parts that correspond to those in the above first embodiment, are denoted by the same reference numerals, the detailed description of which will be omitted.

In the electrostatic chuck device 61 of this embodiment, a lift mechanism which lifts the semiconductor substrate W to be placed on the susceptor 12 is attached at the lower position of the susceptor 12. This lift mechanism comprises a lifter pin 62 and a lift unit 63 which lifts the lifter pin 62 in the vertical direction to the surface of the susceptor 12.

The lifter pin 62 is constructed as a diselectrifying electrode pertaining to the present invention. The lifter pin 62 is accommodated to a through-hole 64 formed in susceptor 12. The tip of the lifter pin 62 contacts with the back surface of the semiconductor substrate W during an electrostatic chuck operation as shown in figure. One lifter pin 62 is shown in the figure, but of course plural lifter pins 62 may be arranged at plural positions.

The lifter pin 62 is made of a conductive material such as a metal, and is fixed to a driving member 63a of the lift unit 63. The lift unit 63 is constituted by a driving source with a high repeat accuracy of the locations such as an electromotive cylinder or a compressed air cylinder. The driving member 63a is moved in the vertical direction by the lift unit 63 as shown in a figure arrow. The lifter pin 62 is moved between the position where the tip of the lifter pin 62 projects from the surface of the susceptor 12 and the position where the lifter pin 62 is accommodated in the through-hole 64, by means of the vertical movement of the driving member 63a. The driving member 63a is attached at the susceptor 12 through a circular insulating member 66 and bellows 65.

The driving member 63a of the lift unit 63 is made of a conductive material such as metal. The lifter pin 62 is connected to the diselectrifying resistance 27 through this driving member 63a. This diselectrifying resistance 27 is connected to ground potential through the switch 38.

In the electrostatic chuck device 61 of this embodiment, it is controlled so that the tip of the lifter pin 62 contacts with the back surface of the semiconductor substrate W by the lift unit 63 during an electrostatic chuck operation. Then, by control of the lifting torque of the lift unit 63, it may make a lifter pin 62 contact with the back surface of the semiconductor substrate W in the range of a pressure that does not affect the electrostatic chuck effect.

An effect similar to that stated above can be obtained by the electrostatic chuck device 61 of this embodiment, and the diselectrification of the semiconductor substrate W can be immediately performed when the electrostatic chuck is canceled. Further, the occurrence of an arc can be prevented between the back surface of the semiconductor substrate W and the tip of the lifter pin 62 by excess current.

Note that, in each of the embodiments, semiconductor substrate W was nominated for example as a substrate to be processed, but, for example, as well as this, the present invention can apply to a glass substrate or a conductor substrate also.

The invention claimed is:

1. An electrostatic chuck device for electrostatically attracting a substrate to be processed, the device comprising;
   a susceptor having a top surface;

plural chuck electrodes for electrically attracting said substrate to said top surface of said susceptor, said chuck electrodes arranged in the inside of said susceptor;

a diselectrifying electrode for diselectrifying said substrate, said diselectrifying electrode arranged on said susceptor so as to be capable of contacting a back surface of said substrate placed on said susceptor;

a diselectrifying potential source;

a diselectrifying resistance connected between said diselectrifying electrode and said diselectrifying potential source;

wherein said diselectrifying electrode is connected to a unit which can move said diselectrifying electrode in a direction toward the top surface of said susceptor.

2. The electrostatic chuck device according to claim 1, further comprising:

switch means which connects/cuts-off electrically between said diselectrifying electrode means and said diselectrifying potential source.

* * * * *